(12) United States Patent
Sharma et al.

(10) Patent No.: US 9,910,543 B2
(45) Date of Patent: Mar. 6, 2018

(54) APPARATUS FOR IMPROVING SIGNAL-TO-NOISE PERFORMANCE OF PROJECTED CAPACITANCE TOUCH SCREENS AND PANELS

(71) Applicant: Microchip Technology Incorporated, Chandler, AZ (US)

(72) Inventors: Attma Sharma, Chandler, AZ (US); Cory Walton, Chandler, AZ (US); Jerry Hanauer, Germantown, WI (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/168,319

(22) Filed: May 31, 2016

(65) Prior Publication Data

US 2016/0274731 A1    Sep. 22, 2016

Related U.S. Application Data

(62) Division of application No. 14/254,164, filed on Apr. 16, 2014, now Pat. No. 9,354,743.

(51) Int. Cl.
*G06F 3/041*    (2006.01)
*G06F 3/044*    (2006.01)
(Continued)

(52) U.S. Cl.
CPC ............ *G06F 3/0418* (2013.01); *G06F 3/044* (2013.01); *G06F 3/0414* (2013.01);
(Continued)

(58) Field of Classification Search
CPC ......... G06F 2203/04106; G06F 3/0414; G06F 3/0416; G06F 3/0418; G06F 3/044; H03K 17/22; H03K 19/017509
See application file for complete search history.

(56) References Cited

U.S. PATENT DOCUMENTS

| 7,460,441 B2 | 12/2008 | Bartling | 368/118 |
| 7,764,213 B2 | 7/2010 | Bartling et al. | 341/152 |

(Continued)

FOREIGN PATENT DOCUMENTS

| WO | 2011/137200 A1 | 11/2011 | G06F 3/044 |
| WO | 2014/038160 A1 | 3/2014 | G02B 27/22 |

OTHER PUBLICATIONS

Skanda, Vinaya, "AN1208: Integrated Power Factor Correction (PFC) and Sensorless Field Oriented Control (FOC) System," Microchip Technology Incorporated, 22 pages, Jun. 17, 2008.
(Continued)

*Primary Examiner* — Hong Zhou
(74) *Attorney, Agent, or Firm* — Slayden Grubert Beard PLLC

(57) ABSTRACT

Improved signal-to-noise performance of projected capacitance touch screens and panels is provided by an integrated circuit regulated high voltage source and high voltage/current drivers coupled to a plurality of projected capacitive touch elements that are controlled by a microcontroller. The single integrated circuit high voltage generator/driver may comprise a voltage boost circuit, a voltage reference, power-on-reset (POR), soft start, a plurality of voltage level shifters and a serial interface for coupling to the microcontroller that may control all functions related to using the projected capacitance touch screens and panels.

18 Claims, 2 Drawing Sheets

(51) Int. Cl.
*H03K 17/22* (2006.01)
*H03K 19/0175* (2006.01)

(52) U.S. Cl.
CPC ........... *G06F 3/0416* (2013.01); *H03K 17/22* (2013.01); *H03K 19/017509* (2013.01); *G06F 2203/04106* (2013.01)

(56) References Cited

U.S. PATENT DOCUMENTS

| | | | |
|---|---|---|---|
| 8,018,176 B1 | 9/2011 | Small et al. | 315/291 |
| 9,354,743 B2 | 5/2016 | Sharma et al. | 345/98 |
| 2008/0165112 A1 | 7/2008 | Su | 345/100 |
| 2008/0309622 A1 | 12/2008 | Krah | 345/173 |
| 2009/0284495 A1* | 11/2009 | Geaghan | G06F 3/0416 345/174 |
| 2010/0007631 A1* | 1/2010 | Chang | G06F 3/044 345/174 |
| 2010/0181180 A1 | 7/2010 | Peter | 200/5 R |
| 2010/0328262 A1* | 12/2010 | Huang | G06F 3/0416 345/174 |
| 2011/0025629 A1* | 2/2011 | Grivna | G06F 3/0416 345/173 |
| 2011/0175835 A1* | 7/2011 | Wang | G06F 3/044 345/173 |
| 2012/0113047 A1 | 5/2012 | Hanauer et al. | 345/174 |
| 2013/0120347 A1 | 5/2013 | Yamamoto et al. | 345/212 |
| 2013/0127746 A1* | 5/2013 | Yeh | G06F 3/0416 345/173 |
| 2013/0257518 A1 | 10/2013 | Hou et al. | 327/517 |
| 2013/0257799 A1* | 10/2013 | Lamont | G06F 3/044 345/174 |
| 2014/0015791 A1 | 1/2014 | Huang et al. | 345/174 |
| 2014/0145986 A1 | 5/2014 | Kuroiwa et al. | 345/173 |
| 2014/0240280 A1* | 8/2014 | Ekici | G06F 3/044 345/174 |
| 2014/0253498 A1 | 9/2014 | Suzuki et al. | 345/174 |

OTHER PUBLICATIONS

Bohn, Bruce, "AN1250: Microchip CTMU for Capacitive Touch Applications," Microchip Technology Incorporated, 22 pages, Jan. 16, 2009.

O'Connor, Todd, "TB3064: mTouch$_{TM}$ Projected Capacitive Touch Screen Sensing Theory of Operation," Microchip Technology Incorporated, 16 pages, © 2010.

Yedamale, Padmaraja et al., "AN1375: See What You Can Do with the CTMU," Microchip Technology Incorporated, 12 pages, May 11, 2011.

International Search Report and Written Opinion, Application No. PCT/US2015/025759, 12 pages, dated Jun. 10, 2015.

* cited by examiner

APPARATUS FOR IMPROVING SIGNAL-TO-NOISE PERFORMANCE OF PROJECTED CAPACITANCE TOUCH SCREENS AND PANELS

CROSS-REFERENCE TO RELATED APPLICATIONS

This application is a divisional of U.S. application Ser. No. 14/254,164 filed on Apr. 16, 2014, which is incorporated herein in its entirety.

TECHNICAL FIELD

The present disclosure relates to projected capacitance touch screens and panels, and, more particularly, to improving signal-to-noise performance of the projected capacitance touch screens and panels.

BACKGROUND

Capacitive touch screens and panels are used as a user interface to electronic equipment, e.g., computers, mobile phones, personal portable media players, calculators, telephones, cash registers, gasoline pumps, etc. In some applications, opaque touch screens and panels provide soft key functionality. In other applications, transparent touch screens overlay a display to allow the user to interact, via touch or proximity, with objects on the display. Such objects may be in the form of soft keys, menus, and other objects on the display. The capacitive touch screen or panel is activated (controls a signal indicating activation) by a change in capacitance of a capacitive electrode in the touch screen or panel when an object, e.g., a user's finger tip, causes the capacitance of the capacitive electrode to change.

Today's capacitive touch screens and panels come in different varieties, including single-touch and multi-touch. A single-touch screen or panel detects and reports the position of one object in contact or proximity with the touch screen or panel. A multi-touch screen or panel detects the position of one or more objects in simultaneous contact or proximity with the touch screen or panel, and reports or acts upon distinct position information related to each object.

Touch screens and panels used in both single-touch and multi-touch systems may comprise one or more layers, each layer having a plurality of electrodes electrically insulated from each other. In a multi-layer touch sensor, the layers may be fixed in close proximity to and electrically insulated from each other. In any of the one or more layer touch screen and panel constructions, the electrodes (capacitances) may form any type of coordinate system (e.g., polar, etc.). Some touch sensors may utilize an X-Y or grid-like arrangement. Referring to FIG. 1, depicted is a schematic plan view of touch sensor electrodes arranged in an X-Y grid orientation, according to the teachings of this disclosure. For example, in a two-layer touch screen or panel 102, electrodes 104 and 105 are on different layers (substrate 106) and may be arranged orthogonal to each other such that the intersections thereof, referred to hereinafter as nodes 120, between the electrodes 104 and 105 on the different layers define a grid (or other coordinate system). In an alternative, single-layer touch screen, the proximity relationship between one set of electrodes and another set of electrodes may similarly define a grid (or other coordinate system).

Measuring the self capacitance of individual electrodes within the touch screen or panel is one method employed by single-touch systems. For example, using an X-Y grid a touch sensor controller iterates through each of the X-axis and Y-axis electrodes 105 and 104, respectively, selecting one electrode at a time and measuring its capacitance. The position of touch is determined by the proximity of (1) the X-axis electrode 105 experiencing the most significant capacitance change, and (2) the Y-axis electrode 104 experiencing the most significant capacitance change.

Performing self capacitance measurements on all X-axis and Y-axis electrodes provides a reasonably fast system response time. However, it does not support tracking multiple simultaneous (X,Y) coordinates, as required in a multi-touch screen system. For example, in a 16×16 electrode grid, the simultaneous touch by one object at position (1,5) and a second object at position (4,10) leads to four possible touch locations: (1,5), (1,10), (4,5), and (4,10). A self-capacitance system is able to determine that X-axis electrodes 1 and 4 have been touched and that Y-axis electrodes 5 and 10 have been touched, but it is not capable of disambiguating to determine which two of the four possible locations represent the actual touch positions.

In a multi-touch screen, a mutual capacitance measurement may be used to detect simultaneous touches by one or more objects. In the X-Y grid touch screen, for example, mutual capacitance may refer to the capacitive coupling between an X-axis electrode and Y-axis electrode. One set of electrodes on the touch screen may serve as receivers and the electrodes in the other set may serve as transmitters. The driven signal on the transmitter electrode may alter the capacitive measurement taken on the receiver electrode because the two electrodes are coupled through mutual capacitance therebetween. In this manner, the mutual capacitance measurement may not encounter the ambiguity problems associated with self capacitance, as mutual capacitance can effectively address every X-Y proximity relationship (node) on the touch sensor.

More specifically, a multi-touch controller using mutual capacitance measurement may select one electrode in a first set of electrodes to be the receiver. The controller may then measure (one by one) the mutual capacitance for each transmitter electrode in a second set of electrodes. The controller may repeat this process until each of the first set of electrodes has been selected as the receiver. The position of one or more touches may be determined by those mutual capacitance nodes, e.g., nodes 120, experiencing the most significant capacitance change. Projected capacitive touch technology comprising self and mutual capacitive touch detection is more fully described in Technical Bulletin TB3064, entitled "mTouch™ Projected Capacitive Touch Screen Sensing Theory of Operation" by Todd O'Connor, available at www.microchip.com; and commonly owned United States Patent Application Publication No. US 2012/0113047, entitled "Capacitive Touch System Using Both Self and Mutual Capacitance" by Jerry Hanauer; wherein both are hereby incorporated by reference herein for all purposes.

Self and mutual capacitance values may be determined by charging or discharging voltages on the self and mutual capacitances of the electrodes. For example, in the capacitive voltage divider (CVD) method a capacitance value may be determined by first measuring the voltage stored on the electrode capacitor then coupling a discharged know value capacitor in parallel with the electrode capacitor and subsequently measuring the resulting equilibrium voltage, or charging the know value capacitor and coupling it to a discharged electrode capacitor. The CVD method is more fully described in Application Note AN1208, available at www.microchip.com; and a more detailed explanation of the CVD method is presented in commonly owned United States Patent Application Publication No. US 2010/0181180, entitled "Capacitive Touch Sensing using an Internal Capacitor of an Analog-To-Digital Converter (ADC) and a Voltage Reference," by Dieter Peter; wherein both are hereby incorporated by reference herein for all purposes.

Using a Charge Time Measurement Unit (CTMU), a very accurate capacitance measurement of the electrode capacitance may be obtained by charging or discharging the electrode capacitor with a constant current source then measuring the resulting voltage on electrode capacitor after an accurately measured time period. The CTMU method is more fully described in Microchip application notes AN1250 and AN1375, available at www.microchip.com, and commonly owned U.S. Pat. No. 7,460,441 B2, entitled "Measuring a long time period;" and U.S. Pat. No. 7,764,213 B2, entitled "Current-time digital-to-analog converter," both by James E. Bartling; wherein all of which are hereby incorporated by reference herein for all purposes.

The charge, Q, on capacitance, C, is directly proportional to the voltage, V, on the capacitance, C, according to the formula: $Q=C*V$. Therefore, the greater the voltage available to charge or discharge the capacitor, the better the resolution in determining the capacitance values of the electrodes' self and mutual capacitances. In addition, the ability to charge and discharge a capacitance with a higher (greater) voltage also improves the signal-to-noise ratio of the capacitance detection circuit since noise is generally a constant impulse or alternating current (AC) voltage that the electrodes may be shielded from to reduce noise pickup thereon. However, voltages from power sources, e.g., batteries, are being reduced to conserve power by the integrated circuit devices. Therefore the availability of higher voltages is diminishing.

SUMMARY

Therefore, a need exists for an integrated solution that provides a voltage source having a well regulated higher output voltage that may be used for charging elements of a touch screen or panel in determining capacitance values thereof.

According to an embodiment, an apparatus for generating a high voltage and selectively coupling the high voltage to a plurality of nodes may comprise: a voltage boost circuit having a high voltage output; a voltage reference coupled to the voltage boost circuit; a plurality of voltage level shifters/drivers, each one having a high voltage input coupled to the high voltage output of the voltage boost circuit and an independently controllable high voltage output; logic circuits coupled to the plurality of voltage level shifters/drivers, wherein the logic circuits control the high voltage outputs thereof; and a serial-to-parallel interface coupled to the logic circuits and the voltage boost circuit.

According to a further embodiment, a power-on-reset (POR) circuit may be coupled to the voltage boost circuit and the serial-to-parallel interface. According to a further embodiment, a soft start circuit may be coupled to the voltage boost circuit. According to a further embodiment, the logic circuits may be a plurality of AND gates. According to a further embodiment, an output enable control may be coupled to an input of each one of the plurality of AND gates. According to a further embodiment, a high voltage output capacitor may be coupled between the output of the voltage boost circuit and a power source common. According to a further embodiment, a boost inductor may be coupled between a power input to the voltage boost circuit and a power source. According to a further embodiment, the outputs of the plurality of voltage level shifters/drivers may be tri-state and having selectable output states at a power source common, the high voltage output or a high off resistance.

According to a further embodiment, the serial-to-parallel interface may further comprise configuration and data storage registers, wherein the configuration register stores parameters of the voltage boost circuit, and the data storage register stores output states of the plurality of voltage level shifters/drivers. According to a further embodiment, during a soft start the outputs of the plurality of voltage level shifters/drivers may be disabled. According to a further embodiment, the voltage boost circuit, the voltage reference, the plurality of voltage level shifters/drivers, the logic circuits and the serial-to-parallel interface may be provided in a single integrated circuit device. According to a further embodiment, the logic circuits and input circuits of the plurality of voltage level shifter/drivers may comprise low voltage and low power devices. According to a further embodiment, output circuits of the plurality of voltage level shifter/drivers may comprise high voltage devices having low impedance drive capabilities.

According to another embodiment, a system for determining locations of touches detecting touches on a projected capacitance touch sensing surface may comprise: a first plurality of electrodes arranged in a parallel orientation having a first axis, wherein each of the first plurality of electrodes may comprise a self capacitance; a second plurality of electrodes arranged in a parallel orientation having a second axis substantially perpendicular to the first axis, the first plurality of electrodes may be located over the second plurality of electrodes and form a plurality of nodes that may comprise overlapping intersections of the first and second plurality of electrodes, wherein each of the plurality of nodes may comprise a mutual capacitance; a high voltage generator/driver may comprise a voltage boost circuit having a high voltage output, a voltage reference coupled to the voltage boost circuit, a plurality of voltage level shifters/drivers, each one having a high voltage input coupled to the high voltage output of the voltage boost circuit and an independently controllable high voltage output coupled to a respective one of the first and second plurality of electrodes, logic circuits coupled to the plurality of voltage level shifters/drivers, wherein the logic circuits control the high voltage outputs thereof, and a serial-to-parallel interface coupled to the logic circuits and the voltage boost circuit; a mixed signal device may comprise a capacitive touch analog front end having a plurality of analog inputs coupled to respective ones of the first and second plurality of electrodes, an analog-to-digital converter (ADC) coupled to the capacitive touch front end, a digital processor and memory, wherein at least one output from the ADC may be coupled to the digital processor; and a serial interface coupled to the digital processor and the serial-to-parallel interface of the high voltage generator/driver; wherein values of the self capacitances may be measured using the high voltage for each of the first plurality of electrodes by the analog front end, the values of the measured self capacitances may be stored in the memory, values of the mutual capacitances of the nodes of at least one of the first electrodes having at least one of the largest values of self capacitance may be measured using the high voltage by the analog front end, the values of the measured mutual capacitances may be stored in the memory and the digital processor uses the stored self and mutual capacitance values for determining locations of the touches and the respective forces applied to the touch sensing surface.

According to a further embodiment, the mixed signal device may be a mixed signal microcontroller integrated circuit. According to a further embodiment, the high voltage generator/driver may comprise an integrated circuit. According to a further embodiment, the high voltage may be greater than a supply voltage powering the high voltage generator/driver and the mixed signal device.

According to yet another embodiment, a method for improving signal-to-noise performance of a projected capacitance touch sensing surface may comprise the steps of: providing a first plurality of electrodes arranged in a parallel orientation having a first axis, wherein each of the first plurality of electrodes may comprise a self capacitance; providing a second plurality of electrodes arranged in a parallel orientation having a second axis substantially perpendicular to the first axis, the first plurality of electrodes may be located over the second plurality of electrodes and form a plurality of nodes that may comprise overlapping intersections of the first and second plurality of electrodes, wherein each of the plurality of nodes may comprise a mutual capacitance; charging the first plurality of electrodes to a voltage greater than a power source voltage; discharging the second plurality of electrodes to a power source common; scanning the first plurality of electrodes for determining values of the self capacitances thereof; comparing the values of the scanned self capacitances to determine which one of the first plurality of electrodes has the largest value of self capacitance; scanning the nodes of the one of the first plurality of electrodes having the largest value of self capacitance for determining values of the mutual capacitances of the respective plurality of nodes; comparing the values of the scanned mutual capacitances of the respective plurality of nodes on the first electrode having the largest value of self capacitance, wherein the node having the largest value of mutual capacitance may be a location of a touch on the touch sensing surface.

According to a further embodiment of the method, the self and mutual capacitance values may be measured with an analog front end and an analog-to-digital converter (ADC). According to a further embodiment of the method, the self and mutual capacitance values may be stored in a memory of a digital processor. According to a further embodiment of the method, the self and mutual capacitance values may be determined by a capacitive voltage divider method. According to a further embodiment of the method, the self and mutual capacitance values may be determined with a charge time measurement unit.

BRIEF DESCRIPTION OF THE DRAWINGS

A more complete understanding of the present disclosure may be acquired by referring to the following description taken in conjunction with the accompanying drawings wherein.

Figure 1:
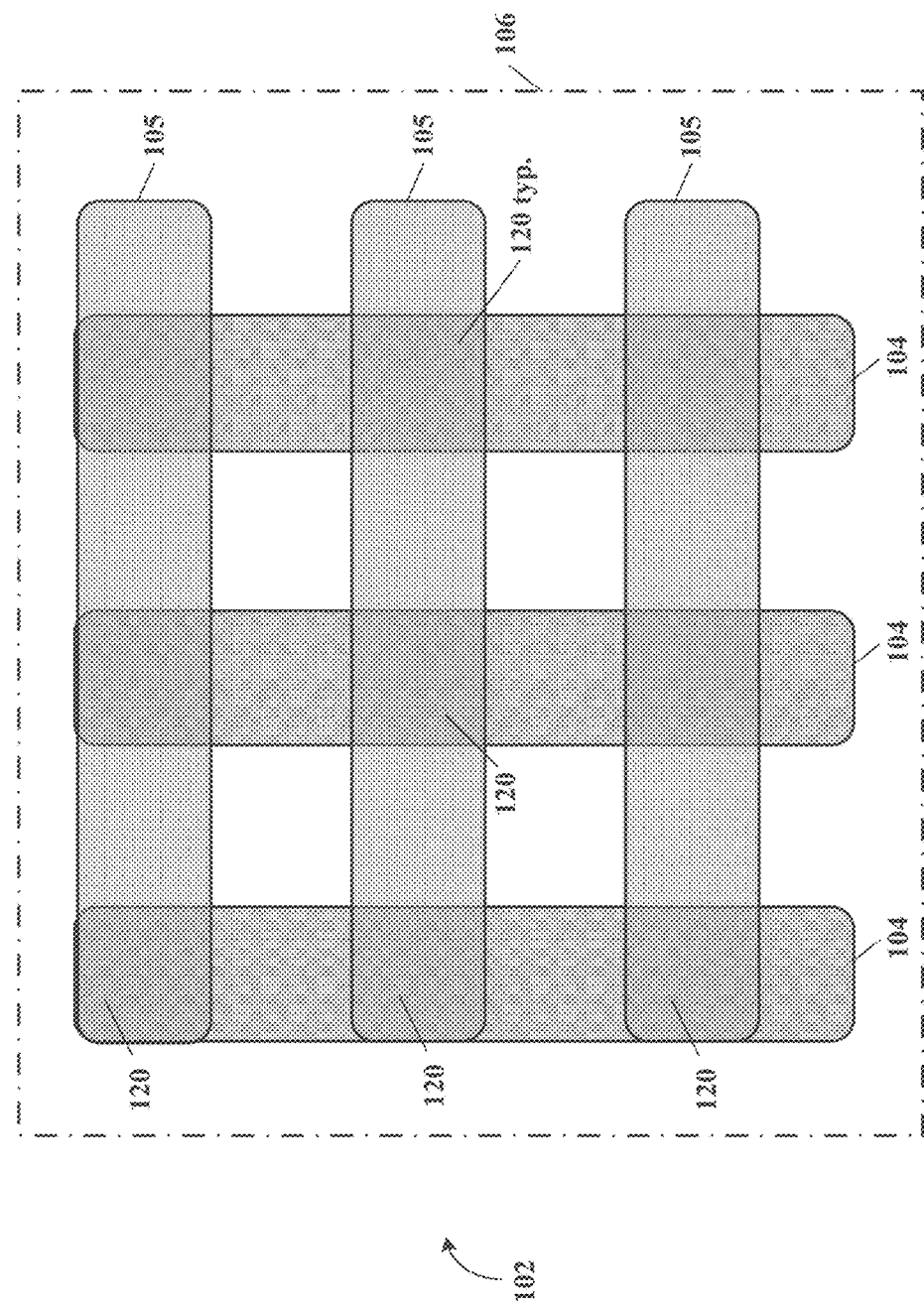
FIG. 1 illustrates a schematic plan view of touch sensor electrodes arranged in an X-Y grid orientation, according to the teachings of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to various embodiments, an integrated solution for providing a regulated high voltage source and high voltage/current drivers for coupling to a plurality of projected capacitive touch elements controlled by a microcontroller is disclosed herein. Wherein a single integrated circuit high voltage generator/driver may comprise a voltage boost circuit, a voltage reference, power-on-reset (POR), soft start, a plurality of low input current voltage level shifters and a serial interface for coupling to a microcontroller that may control all functions related to using projected capacitance touch screens and panels. It is contemplated and within the scope of this disclosure that the aforementioned high voltage generator/driver may also be used to drive high voltage low power displays such as, for example but is not limited to, a vacuum fluorescent display (VFD), a organic light emitting diode (OLED) display, etc.

Referring now to the drawing, the details of a specific example embodiment is schematically illustrated. Like elements in the drawings will be represented by like numbers, and similar elements will be represented by like numbers with a different lower case letter suffix.

Figure 2:
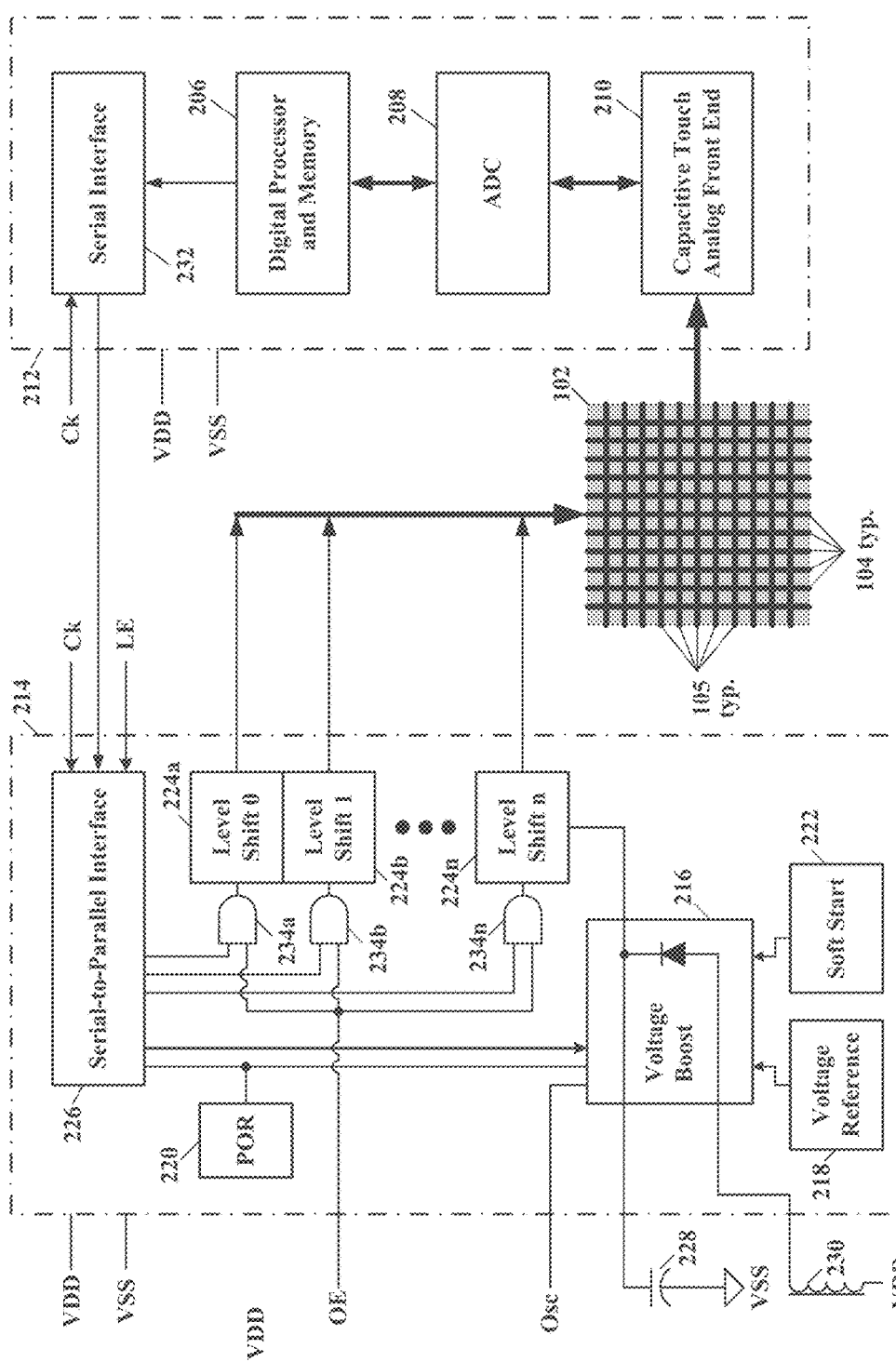
FIG. 2 illustrates a schematic block diagram of an electronic system having a projected capacitance touch screen or panel, a high voltage source/driver and a mixed signal device, according to a specific example embodiment of this disclosure.

Referring to FIG. 2, depicted is a schematic block diagram of an electronic system having a projected capacitance touch screen or panel, a high voltage source/driver and a mixed signal device, according to a specific example embodiment of this disclosure. A mixed signal device 212 may comprise a capacitive touch analog front end 210, an analog-to-digital converter 208, a digital processor and memory 206, and a serial interface 232. A high voltage generator/driver 214 may comprise a voltage boost circuit 216, a voltage reference 218, power-on-reset (POR) 220, a soft start circuit 222, a plurality of voltage level shifters 224, control logic 234 to control drive from the level shifters 224 to the electrodes 104 and 105, and a serial-to-parallel interface 226 for coupling control of the level shifters to a serial interface 232 in the mixed signal device 212. The POR 220 may be used to initialize all memory (storage) elements in the high voltage generator/driver 214 during a power on start-up.

The analog front end 210 of the mixed signal device 212 and the high voltage generator/driver 214 may be coupled to a touch screen or panel 102 comprised of a plurality of conductive columns 104 and rows 105 arranged in a matrix. It is contemplated and within the scope of this disclosure that the conductive rows 105 and/or conductive columns 104 may be printed circuit board conductors, wires, Indium Tin Oxide (ITO) coatings on a clear substrate, e.g., display/touch screen, etc., or any combinations thereof. The mixed signal device 212 may comprise a microcontroller, digital signal processor, application specific integrated circuit (ASIC), programmable logic array (PLA), etc., provided in one or more integrated circuits, packaged or unpackaged (not shown). The high voltage generator/driver 214 may be provided in a single integrated circuit, packaged or unpackaged (not shown).

The voltage boost circuit 216 generates a high voltage (HV) from a power source VDD using a modulated input signal (Osc) in combination with external capacitance 228 and inductance 230. A voltage reference 218 may provide a constant reference voltage to the voltage boost circuit 216 so that HV generated therefrom remains at substantially the same voltage throughout operation of the touch screen or panel 102. The voltage boost circuit 216 may further incorporate current limiting. The voltage boost circuit 216 may be, for example but is not limited to, a switch mode boost power circuit, well know to one having ordinary skill in the design art of integrated circuit power supplies. The HV output from the voltage boost circuit 216 is coupled to the level shifters 224, wherein AND gates 234 control the HV drive outputs of the level shifters 224 that may be coupled to the electrodes 104 and 105. The output enable, OE, may be used to enable/disable the outputs of the level shifters 224 as a group, and outputs of individual level shifters 224 may be controlled by the stored contents of a shift register in the serial-to-parallel interface 226 through the AND gates 234. It is contemplated and within the scope of this disclosure that other logic designs instead of AND gates may be used with equal effectiveness, and one having ordinary skill in digital logic design and the benefit of this disclosure would readily understand how to do so. The logic circuits (e.g., AND gates 234) and the input circuits of the level shifters 224 may comprise low voltage and high impedance circuits to conserve power, and the output circuits of the level shifters 224 may comprise high voltage/current output circuits and components (not shown) having a low impedance to quickly charge the electrode capacitor(s) to the high voltage.

The serial-to-parallel interface 226 may be, for example but is not limited to, an industry standard shift register plus latch type serial interface (SPI), etc. The serial-to-parallel interface 226 may be used to configure the parameters of the voltage boost circuit 216 through a control bus therebetween and select active output channels, e.g., through the AND gates 234 and level shifters 224. A clock and a serial data stream from the serial interface 232 may be used to configure a shift register (not shown) in the serial-to-parallel interface 226 prior to latching the desired data using a Latch Enable (LE) input. Data may be shifted as the most significant bit (MSB) first or last. Either a configuration word or a data word may be clocked in and latched in the serial-to-parallel interface 226. A data word selects the output state of each level shifter driver 224. In a user mode a configuration word may select the boost voltage and current limit parameters of the voltage boost circuit 216.

A soft start circuit 222 may be coupled to the voltage boost circuit 216. The soft start circuit 222 may be used to prevent high initial inrush current from pulling down the power source, VDD, and causing a brown out condition. For example, during the first 10 to 50 milliseconds after the voltage boost circuit 216 is enabled, only the smallest section of a switching transistor thereof may become active and the current may, for example, be limited to a maximum of 200 milliamperes (nominal). The outputs of the level shifters 224 may also be tri-stated during this time. After the soft start has timed out the current limit and switching transistor settings revert to a normal operating value selected by the configuration word. Soft start may also be completely disabled. The current limiting during soft start may be disabled. wherein the smallest sections of the switching transistors are selected and the outputs thereof are tri-stated, but the current limiting circuit is not active.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A system for determining locations of touches detecting touches on a projected capacitance touch sensing surface, said system comprising:
    a first plurality of electrodes arranged in a parallel orientation having a first axis, wherein each of the first plurality of electrodes comprises a self capacitance;
    a second plurality of electrodes arranged in a parallel orientation having a second axis substantially perpendicular to the first axis, the first plurality of electrodes are located over the second plurality of electrodes and form a plurality of nodes comprising overlapping intersections of the first and second plurality of electrodes, wherein each of the plurality of nodes comprises a mutual capacitance;
    a high voltage generator/driver comprising
    a voltage boost circuit having a high voltage output,
    a voltage reference coupled to the voltage boost circuit,
    a plurality of voltage level shifters/drivers, each one having a high voltage input coupled to the high voltage output of the voltage boost circuit and an independently controllable high voltage output coupled to a respective one of the first and second plurality of electrodes,
    logic circuits coupled to the plurality of voltage level shifters/drivers, wherein the logic circuits control the high voltage outputs thereof, and
    a serial-to-parallel interface coupled to the logic circuits and the voltage boost circuit;
    a mixed signal device comprising
    a capacitive touch analog front end having a plurality of analog inputs coupled to respective ones of the first and second plurality of electrodes,
    an analog-to-digital converter (ADC) coupled to the capacitive touch front end,
    a digital processor and memory, wherein at least one output from the ADC is coupled to the digital processor; and
    a serial interface coupled to the digital processor and the serial-to-parallel interface of the high voltage generator/driver;
    wherein values of the self capacitances are measured using the high voltage for each of the first plurality of electrodes by the capacitive touch analog front end, the values of the measured self capacitances are stored in the memory, values of the mutual capacitances of the nodes of at least one of the first electrodes having at least one of largest values of self capacitance are measured using the high voltage by the capacitive touch analog front end, the values of the measured mutual capacitances are stored in the memory and the digital processor uses the stored self and mutual capacitance values for determining locations of the touches and respective forces applied to the touch sensing surface.

2. The system as recited in claim 1, wherein the mixed signal device is a mixed signal microcontroller integrated circuit.

3. The system as recited in claim 1, wherein the high voltage generator/driver comprises an integrated circuit.

4. The system as recited in claim 1, wherein the high voltage is greater than a supply voltage powering the high voltage generator/driver and the mixed signal device.

5. A method for improving signal-to-noise performance of a projected capacitance touch sensing surface, said method comprising the steps of:
   providing a first plurality of electrodes arranged in a parallel orientation having a first axis, wherein each of the first plurality of electrodes comprises a self capacitance;
   providing a second plurality of electrodes arranged in a parallel orientation having a second axis substantially perpendicular to the first axis, the first plurality of electrodes are located over the second plurality of electrodes and form a plurality of nodes comprising overlapping intersections of the first and second plurality of electrodes, wherein each of the plurality of nodes comprises a mutual capacitance;
   charging the first plurality of electrodes to a voltage greater than a power source voltage, wherein the voltage greater than a power source voltage is generated by:
      coupling a voltage reference to a voltage boost circuit;
      generating a high voltage by the voltage boost circuit;
      coupling high voltage inputs of a plurality of voltage level shifters/drivers to a high voltage output of the voltage boost circuit, wherein the plurality of voltage level shifters/drivers each comprise an independently controllable high voltage output; and
      coupling logic circuits to the plurality of voltage level shifters/drivers, wherein the logic circuits control the high voltage outputs thereof;
   discharging the second plurality of electrodes to a power source common;
   scanning the first plurality of electrodes for determining values of the self capacitances thereof;
   comparing the values of the scanned self capacitances to determine which one of the first plurality of electrodes has the largest value of self capacitance;
   scanning the nodes of the one of the first plurality of electrodes having the largest value of self capacitance for determining values of the mutual capacitances of the respective plurality of nodes;
   comparing the values of the scanned mutual capacitances of the respective plurality of nodes on the first electrode having the largest value of self capacitance, wherein the node having the largest value of mutual capacitance is a location of a touch on the touch sensing surface.

6. The method as recited in claim 5, wherein the self and mutual capacitance values are measured with an analog front end and an analog-to-digital converter (ADC).

7. The method as recited in claim 6, wherein the self and mutual capacitance values are stored in a memory of a digital processor.

8. The method as recited in claim 6, wherein the self and mutual capacitance values are determined by a capacitive voltage divider method.

9. The method as recited in claim 6, wherein the self and mutual capacitance values are determined with a charge time measurement unit.

10. The method as recited in claim 5, further comprising:
    providing a serial-to-parallel interface coupled to the logic circuits and the voltage boost circuit, and
    coupling a power-on-reset (POR) circuit to the voltage boost circuit and the serial-to-parallel interface.

11. The method as recited in claim 10, wherein the serial-to-parallel interface further comprises configuration and data storage registers, the method further comprising: storing parameters of the voltage boost circuit and output states of the plurality of voltage level shifters/drivers in the configuration and data storage register.

12. The method as recited in claim 5, wherein the logic circuits are a plurality of AND gates, the method further comprising: coupling an output enable control to an input of each one of the plurality of AND gates.

13. The method as recited in claim 5, further comprising: coupling a high voltage output capacitor between the output of the voltage boost circuit and a power source common.

14. The method as recited in claim 5, further comprising: coupling a boost inductor between a power input to the voltage boost circuit and a power source.

15. The method as recited in claim 5, wherein the outputs of the plurality of voltage level shifters/drivers are tri-state and having selectable output states at a power source common, the high voltage output or a high off resistance.

16. The method as recited in claim 5, further comprising: disabling during a soft start the outputs of the plurality of voltage level shifters/drivers.

17. The method as recited in claim 5, wherein the logic circuits and input circuits of the plurality of voltage level shifter/drivers comprise low voltage and low power devices.

18. The method as recited in claim 5, wherein output circuits of the plurality of voltage level shifter/drivers comprise high voltage devices having low impedance drive capabilities.

* * * * *